United States Patent [19]

Spence et al.

[11] Patent Number: 5,383,195
[45] Date of Patent: Jan. 17, 1995

[54] BIST CIRCUIT WITH HALT SIGNAL

[75] Inventors: Nicholas J. M. Spence, Mesa; Jerome A. Grula, Chandler, both of Ariz.

[73] Assignee: Motorola, Inc., Schaumburg, Ill.

[21] Appl. No.: 962,551

[22] Filed: Oct. 19, 1992

[51] Int. Cl.⁶ ............................................ G06F 11/00
[52] U.S. Cl. .................................. 371/22.5; 371/25.1; 371/22.6; 371/22.5; 371/27
[58] Field of Search .................... 371/22.5, 22.6, 21.1, 371/27

[56] References Cited

U.S. PATENT DOCUMENTS 5,173,906 12/1992 Dreibelbis et al. .................. 371/22.5

Primary Examiner—Emanuel T. Voeltz
Assistant Examiner—K. Shah
Attorney, Agent, or Firm—Rennie W. Dover

[57] ABSTRACT

A BIST circuit that can be placed in a halt mode has been provided. During halt, the operation of the BIST circuit is stopped when an error has been detected thereby allowing for faster location of the error. The BIST circuit also includes a memory access mode which allows for independent read or write access to a predetermined address of a storage device under test.

9 Claims, 2 Drawing Sheets

BIST CIRCUIT WITH HALT SIGNAL

FIELD OF THE INVENTION

This invention relates, in general, to built in self test (BIST) circuitry, and more particularly, for halting the BIST circuitry when an error in the device under test has been detected and for providing access to a storage device for other reasons than BIST testing.

BACKGROUND OF THE INVENTION

The acceptance of compiler-developed integrated circuits, often referred to as application specific integrated circuits (ASICs) or standards cells, developed an increased need for improved test techniques for the large variety of circuits produced by those methods. Improved semiconductor manufacturing procedures provided increased complexity semiconductor devices, while compiler design techniques provided a means to rapidly develop designs of many different semiconductor devices. The resulting proliferation of complex ASIC semiconductor devices increased the need for test methods that were flexible, and that could be compiled concurrently with an ASIC design. One technique, generally referred to as built-in self-test (BIST), placed circuitry on the ASIC device to accomplish testing of the ASIC device. BIST may also be utilized to test ASIC devices that include blocks of random access memory (RAM) that is embedded on the ASIC device.

There are essentially three elements associated with the BIST function: 1) the BIST controller, 2) the data generator, and 3) the data analyzer. The BIST controller provides synchronization and control signals for the BIST operation. The data generator provides a stimulus to the circuit (ASIC) under test. Finally, the data analyzer provides a mechanism for compacting the response from the circuit under test to form a result. Further, the BIST includes an address generator when the device under test is a memory device such as a RAM.

A data analyzer analyzes the output of the device under test. One type of analysis that the data analyzer performs is called comparison analysis wherein an actual output stream from the device under test is compared with an expected result data stream. Whenever a difference between the two data streams occurs, an error has occurred. However, typically the BIST circuit continues to test the device under test and the location of the fault that triggered the error is later investigated. However, it would be advantageous to be able to stop the Operation of the BIST when an error has occurred in order to more quickly determine where the error has occurred and, thus, locate the fault.

Moreover, as mentioned above, the BIST circuitry includes an address generator as well as a data generator when the device under test includes a memory device such as a RAM. Further, it would be advantageous to utilize the already existing BIST circuitry to provide access to a memory device even when the BIST circuitry is not testing the memory device. For example, one may wish to read or write to a RAM when performing various testing at bench.

Hence, there exists a need to provide an improved BIST circuit which has the capability of halting the testing of a device under test when an error has occurred. Moreover, there exists a need to utilize the BIST circuitry already present to provide access to a storage device for other reasons than conventional BIST testing.

DETAILED DESCRIPTION OF THE DRAWINGS

Figure 1:
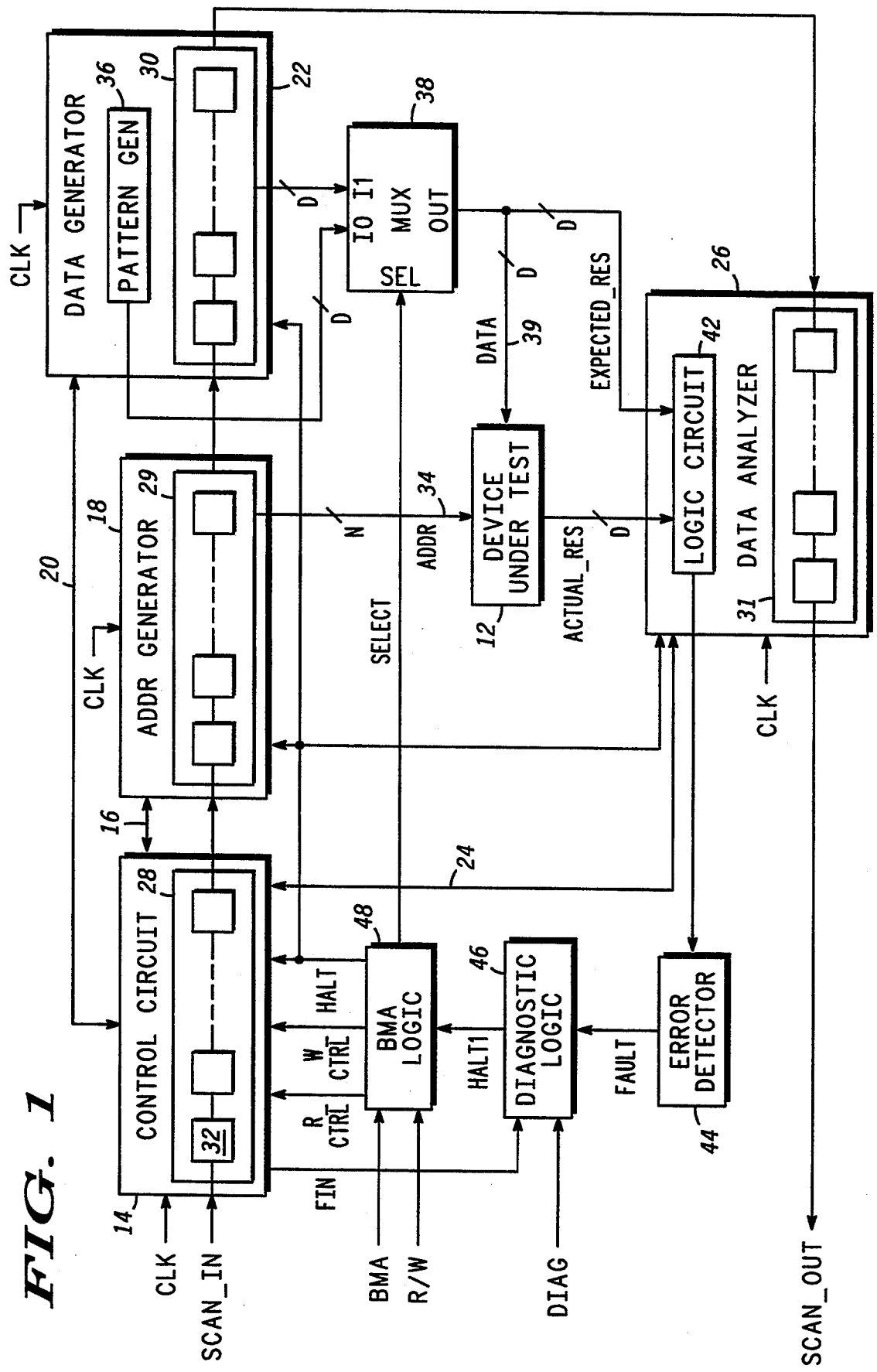
FIG. 1 is a block diagram illustrating a BIST circuit for testing a device in accordance with the present invention.

Referring to FIG. 1, a block diagram illustrating a BIST circuit for testing device under test (DUT) 12 is shown. The BIST circuit includes control circuit 14 having bi-directional control lines 16 being coupled to address generator 18. Control circuit 14 also has bi-directional control lines 20 coupled to data generator 22. Moreover, control circuit 14 has bi-directional control lines 24 being coupled to data analyzer 26.

Clock signal CLK is applied to control circuit 14, address generator 18, data generator 22 and data analyzer 26.

Latching blocks 28–31, which are respectively included within control circuit 14, address generator 18, data generator 22, and data analyzer 26, form a scan chain running through control circuit 14, address generator 18, data generator 22 and data analyzer 26 wherein the input of the scan chain is applied to control circuit 14 via signal $SCAN_{13}IN$ and the output of the scan chain is provided via data analyzer 26 via signal SCAN_OUT. In particular, signal SCAN_IN is applied to an input of latching block 28 whose output is applied to an input of latching block 29. Moreover, an output of latching block 29 is applied to an input of latching block 30. Finally, an output of latching block 30 is coupled to an input of latching block 31, the latter having an output for providing signal SCAN_OUT. It is understood that latching blocks 28–31 include include at least one shift register (to be described in more detail hereinafter) wherein one of the shift registers is denoted by block 32 as shown within latching block 28.

Address generator 18 provides address signal 34 to DUT 12 wherein the width of address signal 34, as denoted by N, is equal to the number of shift registers within latching block 29 which is tailored to be the word length of DUT 12. For example, if DUT 12 was a 1K×4 RAM, address line 34 would have a width equal to 10 so that any given address of the RAM can be loaded into latching block 29.

Data generator 22 includes pattern generator 36 having outputs for generating D bit wide random length sequence patterns as is understood. Multiplexor 38 has a first plurality of inputs coupled to a plurality of output of latching block 30 and a second plurality of inputs coupled to the outputs of pattern generator 36. The output of multiplexor 38 provides a D bit wide data signal DATA to DUT 12 and a D bit wide expected response signal EXPECTED_RES to data analyzer 26. It is understood that D denotes the bit width of each word assuming that DUT 12 is a storage device. For example, if DUT 12 was a 1K ×4 RAM, signal DATA and signal EXPECTED_RES would have a width equal to 4.

DUT 12 is responsive to address signal ADDR and data signal DATA for providing actual response signal ACTUAL_RES to data analyzer 26.

Logic circuit 42 of data analyzer 26 is responsive to signal ACTUAL_RES and signal EXPECTED_RES for providing an output signal to error detector 44.

The output of error detector 44 provides a fault signal FAULT to a first input of diagnostic logic circuit 46 wherein the second input of diagnostic logic circuit 46 is responsive to diagnostic signal DIAG. In addition, diagnostic circuit 46 has a third input coupled to receive a finished signal FINISH from control circuit 14.

An output of diagnostic logic circuit 46 provides signal HALT1 to a first input of BIST Memory Access (BMA) logic circuit 48. Further, signals BMA and R/W are respectively applied to second and third inputs of BMA logic circuit 48. BMA logic circuit 48 provides a first output signal HALT to control circuit 14, address generator 18, data generator 22 and data analyzer 26. Also, BMA logic circuit 48 provides a second output signal to the select input of multiplexor 38 and read and writes control signals, R_CTRL and W_CTRL, to control circuit 14.

In diagnostic BIST operation, signals SELECT, FAULT, HALT1, HALT, BMA and R/W are all logic lows, while signal DIAG is a logic high indicative that the BIST is operating in the diagnostic test mode. Address generator 18 provides an N-bit wide address to DUT 12, while pattern generator 36 provides a D-bit wide data signal to DUT 12 via multiplexor 38. In response to this address and data, DUT 12 generates an actual response (D bits wide) as denoted by signal ACTUAL_RES, which is subsequentially applied to logic circuit 42. Moreover, the output of multiplexor 38 provides an expected response as denoted by signal EXPECTED_RES, to logic circuit 42. It is understood that one embodiment for logic circuit 42 may be an exclusive OR gate thereby functioning as a logic comparator.

When signal ACTUAL_RES differs from signal EXPECTED_RES, logic circuit 42 provides a predetermined signal, for example, a logic high, to error detector 44 thereby denoting that an error has occurred. In response thereto error detector 44 provides a logic high signal to diagnostic logic circuit 46. Moreover, because signal DIAG is also a logic high, the output of diagnostic logic circuit 46 forces signal HALT1 to a logic high. This causes BMA logic circuit 48 to force signal HALT to a logic high wherein signal HALT is subsequently applied to control circuit 14, address generator 18, data generator 22 and data analyzer 26. When signal HALT is a logic high, the contents of the shift registers in the scan chain are maintained such that when an error has occurred the contents of the shift registers can be examined to more quickly detect where the error has occurred. A more detailed description of how the contents of the shift registers are maintained is discussed hereinafter, but for now it suffices to say that simply the contents of the registers are maintained and normal BIST testing does not continue. Moreover, a more detailed description of the operation of logic blocks 46 and 48 is also discussed hereinafter.

Assuming that DUT 12 is a memory device such as a RAM, the present invention also provides a BIST circuit that can be utilized to access the device under test, for example, during bench testing when it is desired to read (or write) data at a particular address of the memory device. This mode is called the BIST memory access (BMA) mode.

In the BMA mode, signal FIN is a logic high which forces signal HALT1 to a logic high. Signal BMA is a logic high which is indicative of operation in the BMA mode. BMA logic circuit 48 normally forces a logic high on signal HALT thereby halting normal operation of the BIST while the scan chain registers are loaded with predetermined values via signal SCAN_IN. For example, the registers of latching block 29 are loaded with a particular address of the memory device. Additionally, latching block 30 is loaded with predetermined data that is desired to be written into the memory device (assuming a write operation is desired).

Signal R/W controls whether it is desired to read or write to a selected memory location of the memory device during BMA mode. In particular, if it is desired to read the contents of a particular address of the memory device, signal R/W is a logic low (which is the default state). On the other hand, if it is desired to write data to the contents of a particular address of the memory device, signal R/W is a logic high.

When signal BMA is high and signal R/W is low (indicating that a read operation is to be performed), signals HALT goes low for one clock pulse thereby taking the BIST out of the halt mode for one clock cycle to allow for reading data stored in the memory device at the address location that was loaded into latching means 29.

However, when signal BMA is high and signal R/W is high (indicating that a write operation is to be performed), signal HALT again goes low for one clock pulse thereby taking the BIST out of the halt mode for one clock cycle to allow for writing data to the memory device at the address location that was loaded into latching means 29.

In addition, it is understood that control signals R_CTRL and W_CTRL are placed in proper logic states to designate either a read from or a write to the memory device.

In summary, diagnostic logic block 46 and BMA logic block 48 include simple logic in order to provide proper logic states of signal HALT, SELECT and R_CTRL and W_CTRL. In diagnostic BIST testing mode, signal HALT is typically a logic low and becomes a logic high when a logic high appears at the output of error detector 44, or when signal FIN goes high indicating that the BIST has finished its testing. In BIST memory access mode, signal FIN is a logic high which subsequently forces signal HALT to a logic high thereby stopping the operation of the BIST circuit. However, when either signal READ or signal WRITE goes high, BMA logic block 48 functions to force signal HALT to a logic low for one clock pulse to allow reading or writing to a predetermined address location of a memory device.

Figure 2:
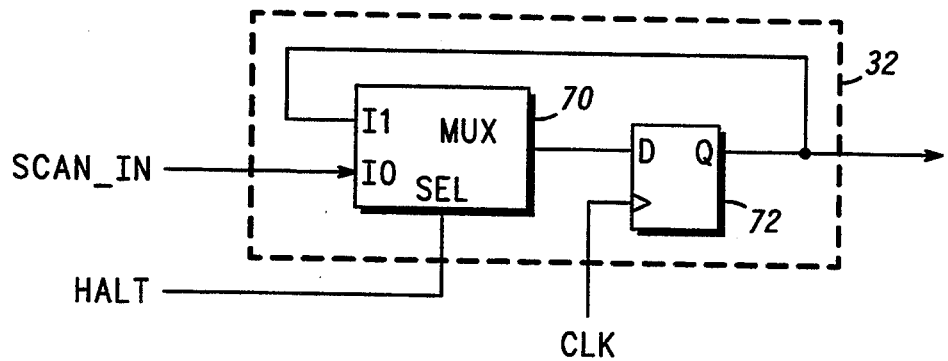
FIG. 2 is a more detailed block diagram illustrating components utilized in FIG. 1 for halting the BIST circuit.

Referring to FIG. 2, a more detailed block diagram illustrating shift register 32 of latching block 28 is shown. Shift register 32 includes multiplexor (MUX) 70 having a first input coupled to receive signal SCAN_IN and a second input coupled to the output of D flip flop 72. The output of multiplexor 70 is coupled to the data input of D flip flop 72, while the clock input of D flip flop 72 is responsive to signal CLK. The select signal (SEL) of multiplexor 70 is responsive to signal HALT. Moreover, the output of D flip flop 72 provides a signal to the next succeeding adjacent shift register within latching block 28. It should be understood that each shift register similar to shift register 32 includes the circuitry shown in FIG. 2. That is, each shift register included in control block 14, address generator 18, data generator 22 and data analyzer 26 takes the form shown in FIG. 2 and is capable of being placed in a halt mode.

In operation, when signal HALT is in a first logic state, for example, a logic low, the BIST is in normal test mode and multiplexor 70 provides signal SCAN_IN to the data input of D flip flop 72. As a result, upon clocking D flip flop 72, data appearing on signal SCAN_IN is transferred to the output of D flip flop 72 as is understood.

However, if signal HALT is in a second logic state, for example, a logic high, the BIST circuit, as well as shift register 32, is placed in a halt mode and the signal appearing at the output of D flip flop 72 is maintained. This is accomplished by applying the output of D flip flop 72 to its data input via the second input of multiplexor 70. Thus, the contents of D flip flop 72 does not change during the halt mode.

Figure 3:
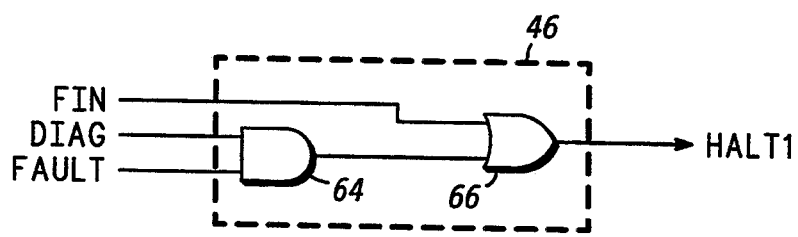
FIG. 3 is detailed logic diagram illustrating the diagnostic logic block shown in FIG. 1.

Referring to FIG. 3, a detailed logic diagram for diagnostic logic block 46 is shown. Diagnostic logic block 46 includes AND gate 64 having a first input coupled to receive signal DIAG and a second input coupled to receive signal FAULT from error detector 44. An output of AND gate 64 is coupled to a first input of OR gate 66, the latter having a second input coupled to receive finished signal FIN. Finally, the output of OR gate 66 provides signal HALT1 to BMA logic block 48.

In operation, signal HALT1 is in a logic high state when both signals DIAG and FAULT are a logic high, or when signal FIN is a logic high. In other words, signal HALT1 is active when a fault has been detected by error detection circuit 44 and when the BIST is operating in a diagnostic testing mode, or when the BIST has completed (finished) its testing.

Figure 4:
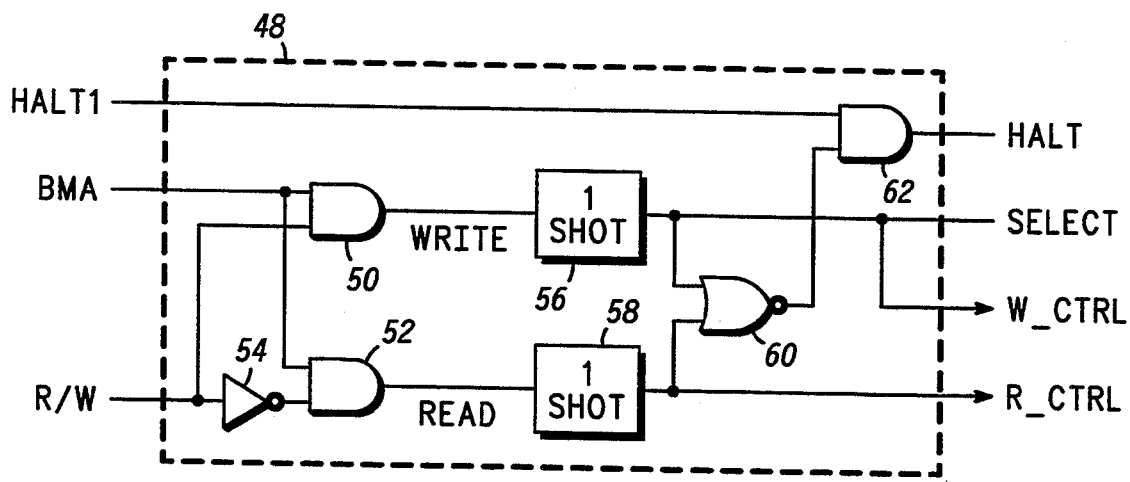
FIG. 4 is a detailed logic diagram illustrating the BMA logic block shown in FIG. 1.

Referring to FIG. 4, a detailed logic diagram for BMA logic block 48 is shown. BMA logic block 48 includes AND gate 50 which has a first input responsive to BIST memory access signal BMA and a second input responsive to read/write signal R/W. AND gate 52 has a first input responsive to signal BMA and a second input responsive to the inversion read/write signal R/W via inverter 54.

The outputs of AND gates 50 and 52 provide signals WRITE and READ, respectively, and are respectively applied to trigger inputs of one shot timers 56 and 58. The outputs of one shot timers 56 and 58 are applied to first and second inputs of NOR gate 60. Further, the output of one shot timer 56 supplies signal SELECT to the select input of multiplexor 38, and write control signal W_CTRL to control circuit 14. Also, the output of one shot timer 58 supplies read control signal R_CTRL to control circuit 14.

The output of NOR gate 60 is coupled to a first input of AND gate 62, the latter having a second input coupled to receive signal HALT1. The output of NOR gate 62 provides signal HALT.

In BMA mode operation, signal HALT1 is a logic high and signals BMA and R/W control whether the BIST is in BIST memory access mode and whether a read or a write operation is desired. In particular, when in BIST memory access mode, signal BMA is a logic high and applied to the first inputs of AND gates 50 and 52. If it is desired to read the contents of a particular address of the memory device, signal R/W is a logic low thereby providing a logic high at the output of AND gate 52 and forcing signal READ to a logic high. This logic high is applied to the trigger input of one shot timer 58 which provides a one shot pulse to the second input of NOR gate 60 thereby forcing signal HALT to a logic low for a period of one clock cycle via AND gate 62. In other words, signal HALT is typically a logic high during BIST memory access mode, but when it is desired to access a particular address of the memory device, signal HALT is forced low via gates 60 and 62 for one clock period to take the BIST out of halt and allow for reading from the memory device. Further, the one shot pulse also forces signal R_CTRL to a logic high for one clock pulse thereby indicating to control circuit 14 that a read operation is desired.

Similarly, if it is desired to write data to a particular address of the memory device, signal R/W is a logic high thereby providing a logic high at the output of AND gate 50 and forcing signal WRITE to a logic high. This logic high is applied to the trigger input of one shot timer 56 wherein one shot 56 provides a one shot pulse to the first input of NOR gate 60 thereby forcing a signal HALT to a logic low for a period of one clock cycle via AND gate 62. Similar to signal R_CTRL, the one shot pulse from timer 56 also forces signal W_CTRL to a logic high for one clock pulse thereby indicating to control circuit 14 that a read operation is desired. It is worth noting that one shot timer 56 may be designed to provide two pulses such that signal HALT is a logic low for two clock pulses thereby allowing data to be written to the memory device and then to subsequently read the data in order to verify its contents. Further, it is also worth noting that the read and write control to the memory device under test may be applied via address signal ADDR, or via a separate control signals (not shown).

By now it should be apparent from the foregoing discussion that a novel BIST circuit has been provided. The BIST circuit can be placed in a halt mode for stopping the operation of the BIST circuit when an error has been detected thereby allowing for faster location of the error. The BIST circuit also includes a memory access mode which allows for independent read or write access to a predetermined address of a storage device under test.

While the invention has been described in terms of particular arrangements and steps, these choices are for convenience of explanation and not intended to be limiting and, as those skilled in the art will understand based on the description herein, the present invention applies to other choices, arrangements and steps, and it is intended to include in the claims that follow, these and other variations as will occur to those of skill in the art based on the present disclosure.

We claim:

1. A BIST circuit for testing a device under test, comprising:

a control circuit for providing a plurality of control signals, said control circuit including first latching means having an input and an output, said input of said first latching means being responsive to an input scan signal;

an address generator responsive to a first portion of said plurality of control signals, said address generator including a second latching means having an input and an output, said input of said second latching means being coupled to said output of said first latching means, said address generator providing an address signal to the device under test;

a data generator responsive to a second portion of said plurality of control signals, said data generator including a pattern generator for generating a random length bit sequence, said data generator including third latching means having an input and an output, said input of said third latching means being coupled to said output of said second latching means;

a first multiplexor having first and second inputs, a select input, and an output, said first input of said first multiplexor being coupled to said third latching means, said second input of said first multiplexor being coupled to said pattern generator, said output of said first multiplexor being coupled to provide a data signal to the device under test;

a data analyzer responsive to a third portion of said plurality of control signals, said data analyzer including fourth latching means having an input and an output, said input of said fourth latching means being coupled to said output of said third latching means, said output of said fourth latching means being coupled to provide an output scan signal, said data analyzer including a first logic circuit having first and second inputs and an output, said first input of said first logic circuit being coupled to receive an output signal from the device under test, said second input of said first logic circuit being coupled to said output of said first multiplexor;

said first, second, third and fourth latching means each including at least one shift register coupled in a serial manner so as to form a scan chain wherein a signals appearing at both an input and an output of said at least one shift register are scan chain signals; and an error detector having an input and an output, said input of said error detector being coupled to said output of said first logic circuit, said output of said error detector providing a fault signal; and logic circuit means having a plurality of inputs for providing a halt signal at a first output thereof, a first one of said plurality of inputs being coupled to said output of said error detector, a second one of said plurality of inputs being coupled to receive a diagnostic signal such that if said fault signal and said diagnostic signal are in predetermined logic states said halt signal is forced to a first logic state thereby stopping the operation of the BIST circuit, said logic circuit means also providing a select signal to said select input of said first multiplexor.

2. The BIST circuit according to claim I wherein each one of said shift registers within said first, second, third and fourth latching means includes:

a second multiplexor having first and second inputs, a select input, and an output, said first input of said second multiplexor being coupled to receive a first signal of said scan chain, said select input of said second multiplexor being coupled to receive said halt signal;

a D-flipflop having a data input, a clock input and an output, said data input of said D-flipflop being coupled to said output of said second multiplexor, said clock input of said D-flipflop being coupled to receive a clock signal, said output of said D-flipflop being coupled to said second input of said second multiplexor, said output of said D-flipflop also providing a second signal of said scan chain.

3. The BIST circuit according to claim 2 wherein said logic circuit means includes:

a first AND gate having first and second inputs and an output, said first input of said first AND gate being coupled to receive said diagnostic signal, said second input of said first AND gate being coupled to receive said fault signal; and a first OR gate having first and second inputs and an output, said first input of said first OR gate being coupled to receive a finish signal, said second input of said first OR gate being coupled to said output of said first AND gate; said output of said first OR gate providing said halt signal.

4. A BIST circuit for testing a device under test, comprising:

a control circuit for providing a plurality of control signals, said control circuit including first latching means having an input and an output, said input of said first latching means being responsive to an input scan signal;

an address generator responsive to a first portion of said plurality of control signals, said address generator including a second latching means having an input and an output, said input of said second latching means being coupled to said output of said first latching means, said address generator providing an address signal to the device under test;

a data generator responsive to a second portion of said plurality of control signals, said data generator including a pattern generator for generating a random length bit sequence, said data generator including third latching means having an input and an output, said input of said third latching means being coupled to said output of said second latching means;

a first multiplexor having first and second inputs, a select input, and an output, said first input of said first multiplexor being coupled to said third latching means, said second input of said first multiplexor being coupled to said pattern generator, said output of said first multiplexor being coupled to provide a data signal to the device under test;

a data analyzer responsive to a third portion of said plurality of control signals, said data analyzer including fourth latching means having an input and an output, said input of said fourth latching means being coupled to said output of said third latching means, said output of said fourth latching means being coupled to provide an output scan signal, said data analyzer including a first logic circuit having first and second inputs and an output, said first input of said first logic circuit being coupled to receive an output signal from the device under test, said second input of said first logic circuit being coupled to said output of said first multiplexor;

said first, second, third and fourth latching means each including at least one shift register coupled in a serial manner so as to form a scan chain wherein a signals appearing at both an input and an output of said at least one shift register are scan chain signals; and an error detector having an input and an output, said input of said error detector being coupled to said output of said first logic circuit, said output of said error detector providing a fault signal;

a second logic circuit having a plurality of inputs and an output for providing an output signal, a first one of said plurality of inputs being coupled to said output of said error detector, a second one of said plurality of inputs being coupled to receive a diagnostic signal, a third one of said plurality of inputs being coupled to receive a finished signal from said control circuit, wherein if said fault signal and said diagnostic signal are in predetermined logic states said output signal of said second logic circuit is forced to a first logic state; and a third logic circuit having a plurality of inputs for providing a pluralilty of outputs, a first one of said plurality of inputs of said third logic circuit being coupled to said output of said second logic circuit, a second one of said plurality of inputs of said third logic circuit being coupled to receive memory access signal, a third one of said plurality of inputs of said third logic circuit being coupled to receive a read/write signal, a first one of said plurality of outputs providing a halt signal to said control circuit, said address generator, said data generator and said data analyzer for stopping the operation of the BIST circuit, a second one of said plurality of outputs providing a select signal to said select input of said first multiplexor, third and fourth ones of said plurality of outputs providing read and write control signals to said control circuit.

5. The BIST circuit according to claim 4 wherein each one of said shift registers within said first, second, third and fourth latching means includes:

a second multiplexor having first and second inputs, a select input, and an output, said first input of said second multiplexor being coupled to receive a first signal of said scan chain, said select input of said second multiplexor being coupled to receive said halt signal;

a D-flipflop having a data input, a clock input and an output, said data input of said D-flipflop being coupled to said output of said second multiplexor, said clock input of said D-flipflop being coupled to receive a clock signal, said output of said D-flipflop being coupled to said second input of said second multiplexor, said output of said D-flipflop also providing a second signal of said scan chain.

6. The BIST circuit according to claim 5 wherein said second logic circuit includes:

a first AND gate having first and second inputs and an output, said first input of said first AND gate being coupled to receive said diagnostic signal, said second input of said first AND gate being coupled to receive said fault signal; and a first OR gate having first and second inputs and an output, said first input of said first OR gate being coupled to receive said finish signal, said second input of said first OR gate being coupled to said output of said first AND gate; said output of said first OR gate providing said output signal of said second logic circuit.

7. The BIST circuit according to claim 6 wherein said third logic circuit includes:

a second AND gate having first and second inputs and an output, said first input of said second AND gate being coupled to receive said memory access signal, said second input of said second AND gate being coupled to receive said read/write signal;

a third AND gate having first and second inputs and an output, said first input of said third AND gate being coupled to receive said memory access signal, said second input of said third AND gate being coupled to receive an inversion of said read/write signal;

a fourth AND gate having first and second inputs and an output, said first input of said fourth AND gate being coupled to receive said output signal of said second logic circuit, said output of said fourth AND gate providing said halt signal;

a first one shot timer having a trigger input and an output, said trigger input of said first one shot timer being coupled to said output of said second AND gate, said output of said first one shot timer providing said select signal and said write control signal;

a second one shot timer having a trigger input and an output, said trigger input of said second one shot timer being coupled to said output of said third AND gate, said output of said second one shot timer providing said read control signal; and a first NOR gate having having first and second inputs and an output, said first and second inputs of said first NOR gate being respectively coupled to said outputs of said first and second one shot timers, said output of said NOR gate being coupled to said second input of said fourth AND gate.

8. A method for utilizing a BIST circuit to access a predetermined address location of a memory device, the BIST circuit including a control circuit, an address generator, a data generator and a data analyzer, the method comprising the steps of:

(a) placing the BIST circuit in an inactivated state in response to a logic signal thereby stopping the operation of the BIST circuit;

(b) loading the address generator with a predetermined address of the memory device;

(c) activating the BIST circuit for a predetermined number of clock cycles so as to allow access to the memory device at said predetermined address.

9. The method according to claim 8 further including the step of loading the data generator with predetermined data when writing to the memory device is desired.

* * * * *